(12) United States Patent
Wong et al.

(10) Patent No.: US 7,642,575 B2
(45) Date of Patent: Jan. 5, 2010

(54) INTEGRATED ELECTRONIC MICROPHONE HAVING A PERFORATED RIGID BACK PLATE MEMBRANE

(75) Inventors: Man Wong, New Territories (HK); Yitshak Zohar, Kowloon (HK)

(73) Assignee: The Hong Kong University of Science and Technology, Kowloon (HK)

( * ) Notice: Subject to any disclaimer, the term of this patent is extended or adjusted under 35 U.S.C. 154(b) by 0 days.

(21) Appl. No.: 11/647,382

(22) Filed: Dec. 29, 2006

(65) Prior Publication Data

US 2007/0108541 A1 May 17, 2007

Related U.S. Application Data

(60) Continuation of application No. 10/725,388, filed on Dec. 3, 2003, now abandoned, which is a division of application No. 10/050,858, filed on Jan. 18, 2002, now Pat. No. 6,677,176.

(51) Int. Cl.
   *H01L 27/20* (2006.01)
   *H01L 29/84* (2006.01)
(52) U.S. Cl. ............... 257/254; 257/416; 381/174
(58) Field of Classification Search ........... 257/254, 257/416; 381/174
   See application file for complete search history.

(56) References Cited

U.S. PATENT DOCUMENTS

| | | | |
|---|---|---|---|
| 4,533,795 A | 8/1985 | Baumhauer, Jr. et al. | |
| 4,558,184 A | 12/1985 | Busch-Vishniac et al. | |
| 4,993,072 A | 2/1991 | Murphy | |
| 5,573,679 A | 11/1996 | Mitchell et al. | |
| 5,585,300 A | 12/1996 | Summerfelt | |
| 5,684,324 A | 11/1997 | Bernstein | |
| 6,441,451 B1 * | 8/2002 | Ikeda et al. | 257/418 |
| 6,479,878 B1 | 11/2002 | Okawa et al. | |
| 6,698,295 B1 * | 3/2004 | Sherrer | 73/754 |

OTHER PUBLICATIONS

Bergqvist et al., "Capacitive Microphone with a Surface Micromachined Backplate Using Electroplating Technology", Journal of Microelectromechanical Systems, vol. 3, No. 2, Jun. 1994, pp. 69-75, IEEE (1994).

Zou, Q.B., et al. "Design and Fabrication of a Novel Integrated Floating-Electrode-'Electret'-Microphone (FEEM)", Proceedings of the 11th International Workshop on Micro Electro Mechanical Systems, Jan. 1998, pp. 586-590, IEEE (1998).

Murphy, P., et al., "Subminiature Silicon Integrated Electret Condenser Microphone", 6th International Symposium on Electrets (ISE 6) Proceedings, 1988, abstract.

* cited by examiner

*Primary Examiner*—Howard Weiss
(74) *Attorney, Agent, or Firm*—Buchanan Ingersoll & Rooney PC

(57) ABSTRACT

The present invention provides an integrated electronic microphone formed as part of a semiconductor device, and a manufacturing method therefor. The microphone is formed with a sensing electrode as part of a sensing membrane, and the sensing electrode is connected to the gate of a sensing transistor to provide an output. The microphone may be operated in constant bias or constant charge mode.

10 Claims, 6 Drawing Sheets

INTEGRATED ELECTRONIC MICROPHONE HAVING A PERFORATED RIGID BACK PLATE MEMBRANE

This application is a continuation of application Ser. No. 10/725,388, filed Dec. 3, 2003, now abandoned which is a divisional of application Ser. No. 10/050,858, filed Jan. 18, 2002, now U.S. Pat. No. 6,677,176.

FIELD OF THE INVENTION

This invention relates to a novel design for an integrated electronic microphone, and in particular to such a microphone that can be manufactured by microfabrication techniques, and to methods of manufacturing such a microphone.

BACKGROUND OF THE INVENTION

Miniaturized microphones are used in a wide range of applications, such as cell phones, hearing aids, smart toys and surveillance devices for example. It would be desirable to design such microphones and manufacturing methods therefor that allow batch production and allow the integration of the microphone with miniaturised devices having other functions. Microfabrication of various types of miniature microphones has been explored.

PRIOR ART

U.S. Pat. No. 5,573,679 disclosed capacitive microphones that are fabricated using etch-release of sacrificial silicon by an isotropic dry etchant. The process allows the production of a microphone largely from chemical vapour deposition processes with flexibility in the materials selection. The dry etch chemistry does not require freeze-drying after release, and the etchant does not attack electrodes or metallized circuitry and so allows placement of the electrodes between the backplate and diaphragm dielectric layers. Diffusion barrier layers between the sacrificial and electrode layers protect both materials from interdiffusion during device fabrication. This process is especially suitable for forming a microphone comprising silicon nitride dielectric layers with aluminium electrodes.

U.S. Pat. No. 4,558,184 describes an electroacoustic transducer, such as a microphone, which may be integrated into a semiconductor chip, and a method of fabrication. The semiconductor is etched to produce a membrane having a sufficiently small thickness and an area sufficiently large that the membrane can vibrate at audio frequencies. Electrodes are provided in relation to the membrane so that an electrical output signal can be derived from the vibrations due to variable capacitance.

U.S. Pat. No. 4,533,795 describes an electroacoustic transducer, preferably in the form of a capacitive microphone, for incorporation into a semiconductor substrate. The vibrating element comprises a largely nontensioned diaphragm, such as an epitaxial layer formed on the semiconductor substrate, so as to greatly reduce its mechanical stiffness. The substrate is etched away in the desired area to define the diaphragm and form an acoustic cavity. A continuous array of microscopic holes is formed in the backplate to cut down the lateral flow of air in the gap between the capacitor electrodes. Narrow gaps made possible by the hole array allow low voltage diaphragm biasing.

Also known from the literature are Bergavist et al. "*Capacitive microphone with a surface micromachined backplate using electroplating technology*", *Journal of Microelectromechanical Systems*, Vol. 3 No. 2 (June 1994) pp. 69-75 which describes a technology for surface micromachining of free-standing metal microstructures using metal electrodeposition on a sacrificial photoresist layer as applied to a condenser microphone. Murphy. P et al. "*Subminiature silicon integrated electret condenser microphone*" 6$^{th}$ International Symposium on Elecrets (ISE 6) Proceedings describes a structure for a microphone which uses one silicon wafer to support a thin polyester diaphragm and a second to carry a Teflon electret. Subassemblies are diced from the wafer and bonded together to form complete microphones. Finally, Zou, O. B. et al. "*Design and fabrication of a novel integrated floating-electrode "Electret" microphone (FEEM)*" Proceedings of the 11$^{th}$ IEEE International Workshop on Micro Electro Mechanical Systems January 1998, pp586-590, describes an electret microphone implemented on a single chip fabrication technique. The microphone uses a charged floating electrode surrounded by highly insulated materials as the "electret" to excite the electric field.

SUMMARY OF THE INVENTION

According to the present invention there is provided a semiconductor device comprising a microphone formed in an integrated manner and comprising a sensing electrode formed as part of an acoustic pressure sensing membrane, and a counter electrode in the form of a perforated rigid back-plate membrane, wherein said sensing electrode is connected to the gate of a sensing transistor.

In one embodiment the device may be operable in a constant bias mode. For example, the counter electrode may be set to a bias voltage and the potential of the sensing electrode and hence the gate potential of the sensing transistor may vary in accordance with the acoustic pressure, with the gate potential being biased in the conducting regime whereby variations in the gate voltage vary the output voltage of the sensing transistor.

Another possibility is that the potential of the sensing electrode may be fixed and an output current from the sensing electrode or the counter electrode and varying in response to acoustic pressure on the sensing membrane is taken as the output signal.

In another embodiment the device is operable in a constant charge mode by first charging the sensing electrode followed by setting the potential of the counter electrode to ground and biasing the sensing transistor to a conducting state. The charging of the sensing electrode may be by tunneling from a substrate, or may be by injection from the sensing transistor.

Preferably the sensing membrane is formed of a layer of an insulating material and a layer of a conducting material. The insulating material may comprise low stress silicon nitride, and the conducting material may comprise polysilicon.

Preferably the counter electrode is formed of a layer of a first conducting material and a layer of a second conducting material. In particular the second conducting material may be a relatively hard material and may be sandwiched between two layers of said first conducting material which is preferably a relatively soft material. For example the first material may be aluminium and the second material titanium.

Viewed from another broad aspect the present invention provides a method of forming an integrated semiconductor device including a microphone, comprising the steps of:

(a) depositing a first layer of an insulating material on a substrate to form a part of an acoustic sensing membrane, (b) depositing a layer of conducting material on said layer of insulating material, (c) depositing a second layer of an insulating material on said conducting material,
(d) depositing a sacrificial layer on said second layer of insulating material,
(e) depositing at least one rigid conducting material on said sacrificial layer to define a rigid counter electrode,
(f) forming a plurality of holes in said counter electrode,
(g) etching said substrate from a back side thereof to expose said membrane, and
(h) removing said sacrificial layer by etching through said holes to leave an airgap between said membrane and said counter electrode.

Preferably, before step (a), the substrate is subject to an isolation technique to separate on the substrate an area for the membrane, an area for a tunneling window, and areas for forming at least one sensing transistor and a substrate contact.

Preferably the conducting layer of the membrane also forms the gate electrode(s) of at least one sensing transistor.

Viewed from a still further broad aspect the present invention provides a method of forming a semiconductor device including a membrane, comprising the steps of:
(a) depositing a membrane forming material on a substrate,
(b) depositing a sacrificial layer of polysilicon on said membrane forming material,
(c) constructing a further semiconductor device structure on said substrate and over said sacrificial layer,
(d) removing said sacrificial layer, and
(e) etching a back side of said substrate to expose said membrane.

Viewed from a yet further broad aspect the present invention provides a method of forming a semiconductor device including a membrane, comprising the steps of:
(a) depositing a first membrane forming material on a substrate, said first membrane forming material being an insulating material,
(b) depositing a second membrane forming material on said first membrane forming material, said second membrane forming material being a conducting material and said second membrane forming material extending beyond said first membrane forming material so as to contact said substrate, whereby charges may be injected into said conducting material.
(c) depositing a sacrificial layer on said second membrane forming material,
(d) constructing a further semiconductor device structure on said substrate and over said sacrificial layer,
(e) removing said sacrificial layer, and
etching a back side of said substrate to expose said membrane.

BRIEF DESCRIPTION OF THE DRAWINGS

An embodiment of the invention will now be described by way of example and with reference to the accompanying drawings in which.

DETAILED DESCRIPTION OF PREFERRED EMBODIMENT

Figure 1:
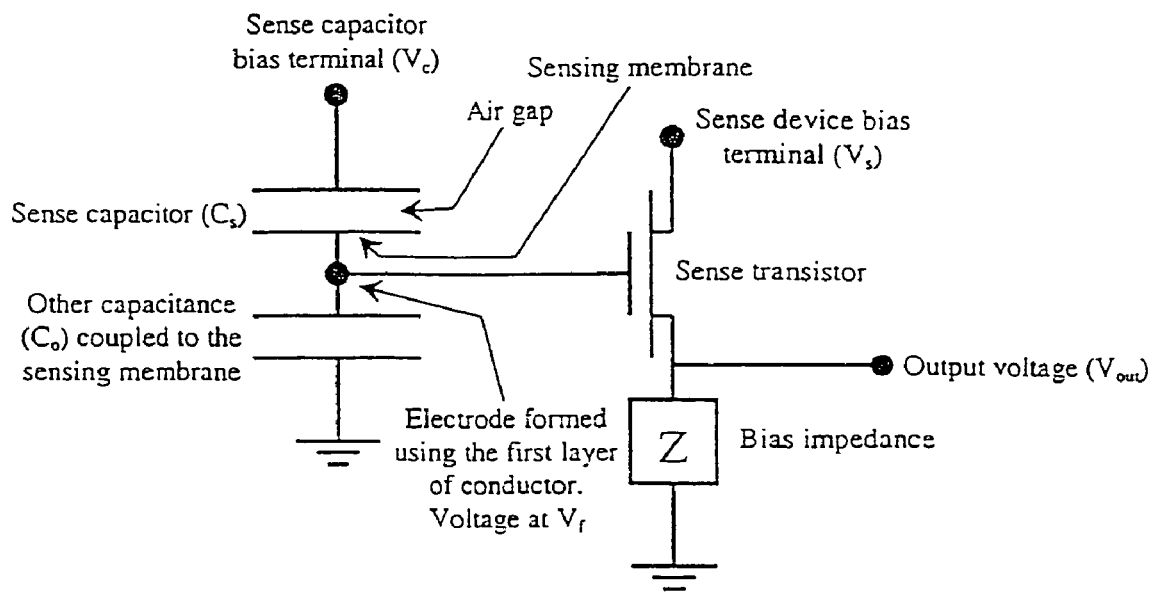
FIG. 1 is a circuit diagram showing an equivalent circuit model.

Referring firstly to FIG. 1 there is shown an equivalent circuit model of a microphone in accordance with an embodiment of the invention. At the heart of the microphone is a sense capacitor formed of a sensing membrane which is responsive to acoustic excitation, and a rigid counter electrode, with an airgap between the membrane and the counter electrode. The sensing membrane is formed with an electrode which is connected to or formed integrally with the gate of a sense transistor. The counter electrode may be connected to a bias terminal, and a further capacitance may be connected to the sense capacitor.

This microphone design can be operated in a number of modes.

Firstly, in a constant bias mode $V_c$ is set and $V_f$ is fixed accordingly via capacitive coupling, namely:

$$V_f = V_c \frac{C_o}{C_o + C_s}.$$

The sense transistor, the gate potential of which is $V_f$, is biased in the conducting regime. When the sensing membrane is deflected in response to an acoustic pressure (p), the sense capacitance $C_s$ and hence $V_f$ is modulated. Consequently the conductance of the sense transistor is changed and the output voltage $V_{out}$ is modulated accordingly.

An alternative way of operating in the constant bias mode is to set $V_f$ to some fixed bias by providing an external electrical contact to the sensing electrode. The signal sensed would then be a varying current $I_{out}$ which could be taken from either the $V_c$ or the $V_f$ terminal, namely:

$$I_{out} = (V_c - V_f) \frac{dC_s}{dp} \frac{dp}{dt}.$$

Figure 6:
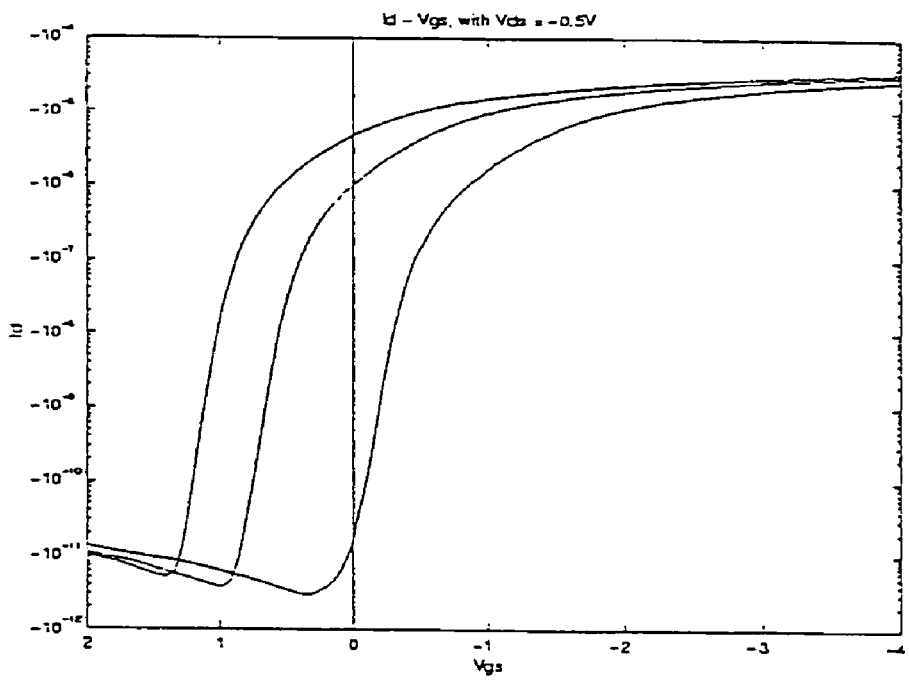
FIG. 6 shows the current-voltage (I-V) characteristics of the sense transistor with different levels of programming.
Figure 7:
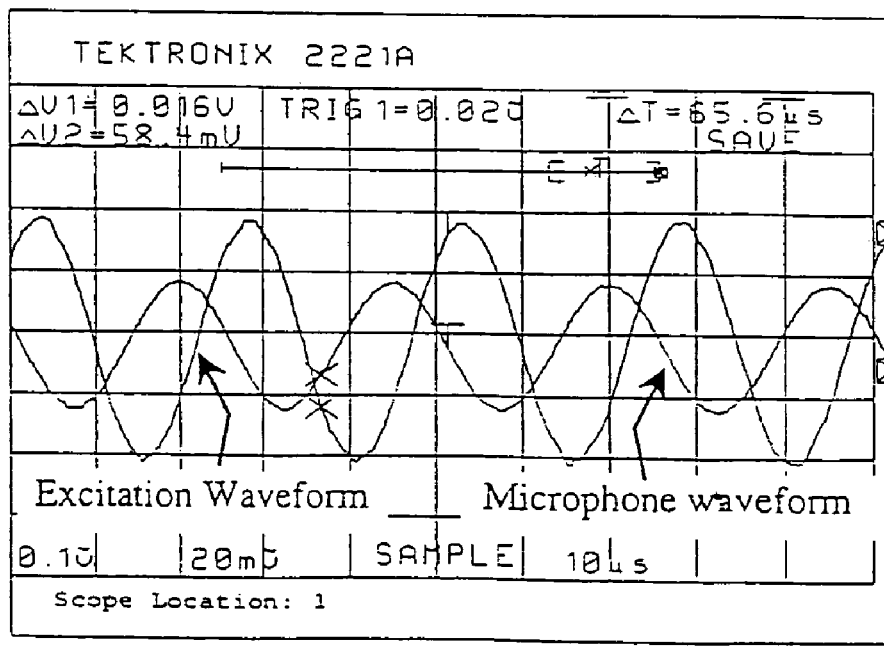
FIG. 7 is a trace showing the response of a microphone in accordance with an embodiment of the invention to an acoustic excitation.

In a constant charge mode, the electrically isolated sensing electrode is first charged using a tunneling current established by applying a high $V_c$ to the capacitor stack and electrons enter through a tunneling window from the substrate. Alternatively charging can be accomplished by injecting into the isolated electrode hot electrons generated at the drain of the sense transistor. Subsequent to the injection, $V_c$ is set to electrical ground and the sense transistor is biased to a conducting state. The voltage on the sensing membrane is:

$$V_f = \frac{Q_f}{C_o + C_s},$$

Where $Q_f$ is the total stored charge. When an acoustic excitation is applied to the sensing membrane, $C_s$ and hence $V_f$ is modulated. The output voltage is thus modulated accordingly as before. FIG. 6 shows the simulated I-V characteristics of the sensing transistor with different levels of programming, that is to say with different storage of charge in the storage electrode. The right-most curve is the I-V before programming, the middle and left most curves are I-V characteristics with progressively more electrons being stored in the storage electrode.

FIGS. 2(a)-(e) show the fabrication process of a microphone in accordance with an embodiment of the present invention. Although in a practical device more than one sensing transistor will be provided, in this example for the sake of clarity only a p-type sensing metal-oxide-semiconductor (MOS) field effect transistor is shown. Furthermore, extensions of the fabrication process to CMOS circuits containing additionally one or more transistors of n-type polarity can easily be achieved using conventional fabrication techniques as would be readily understood by a skilled reader.

Figure 2A:
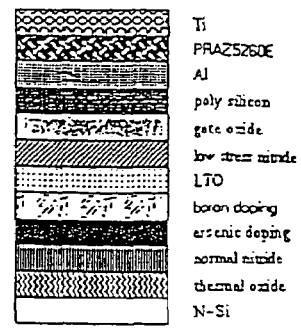
FIG. 2 shows the main steps of the fabrication process
Figure 2A:
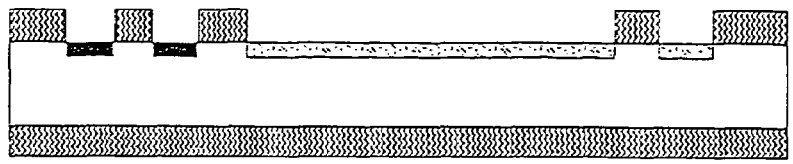

Referring firstly to FIG. 2(a), the device isolation structures are formed, constructed using techniques including but not limited to the local oxidation of silicon (LOCOS), separating the transistors, the tunneling window, the substrate contact region and the membrane. Boron doping is carried out to adjust the characteristics of the transistors, while the tunneling window and the substrate contact region are heavily doped n-type, using dopants such as phosphorous or arsenic.

Figure 2B:
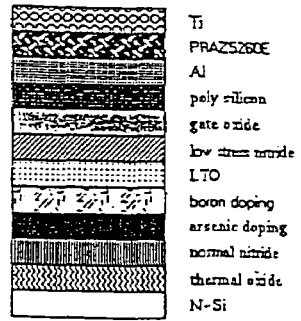
Figure 2B:
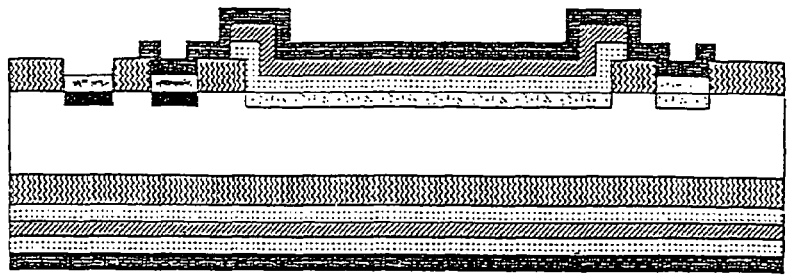

As shown in FIG. 2(b), a first layer of insulator, such as low stress nitride, is deposited and patterned to eventually form a part of the acoustic sensing membrane. Next the gate dielectric, such as silicon oxide, is formed for the transistors. A first layer of conductor, such as polycrystalline silicon (poly-Si) is deposited and patterned to form one electrode of the sensing capacitor and the gate electrodes of the transistors. Self-aligned boron doping of the gate, source and drain regions of the transistors is done at this stage.

Figure 2C:
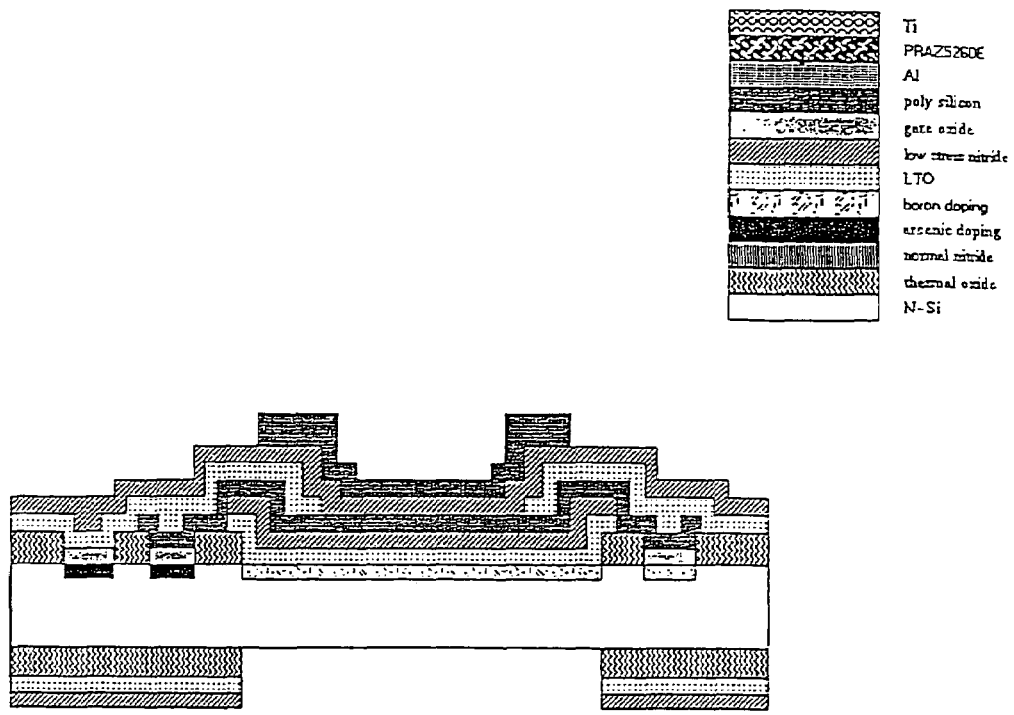

In FIG. 2(c) a second layer of insulator, such as low stress nitride, is deposited. This layer could, optionally, completely isolate the portion of the first layer of conductor that forms part of the membrane. Patterning of the access to the membrane from the back side of the wafer is next defined. This is followed by the deposition and patterning on the front side of the wafer a layer of sacrificial layer, such as poly-Si, the thickness of which determines the dimension of the air-gap to be formed.

Figure 2D:
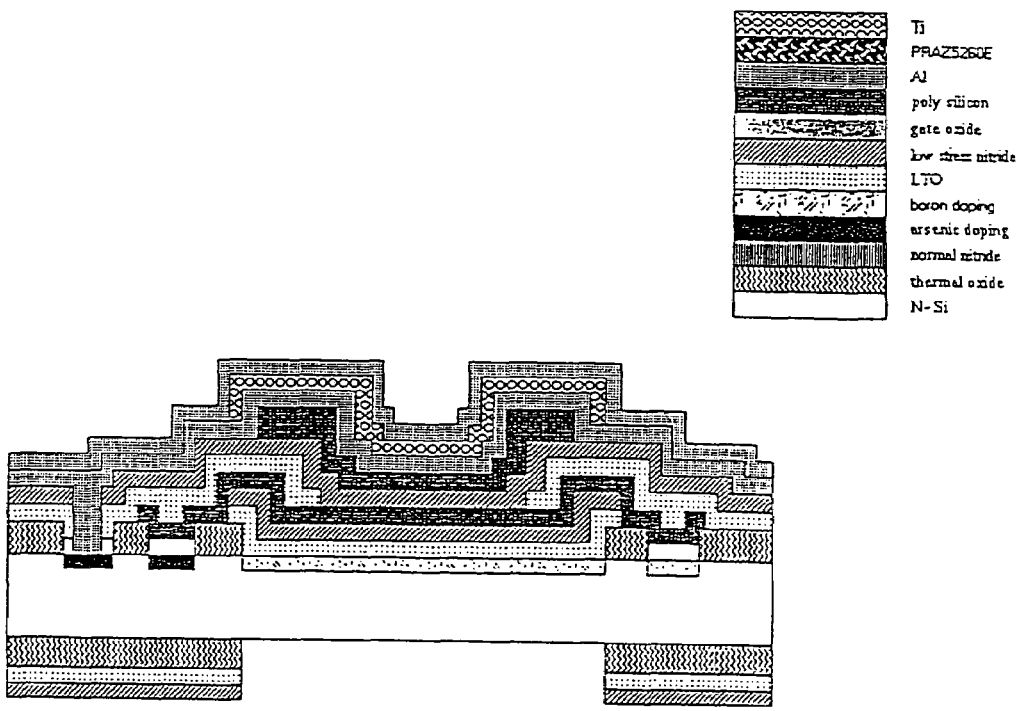

In FIG. 2(d) contact holes are opened before a second layer of conducting thin film, such as aluminium, is deposited. Part of the second layer of conducting thin film forms the top, mechanically rigid, counter-electrode plate of the capacitor. A layer of hard conductor, such as titanium, is selectively deposited and patterned on the capacitor to reinforce the stiffness of this plate. A third layer of conducting thin film, again possibly aluminium, is next deposited to balance the mechanical stress distribution in the plate.

Figure 2E:
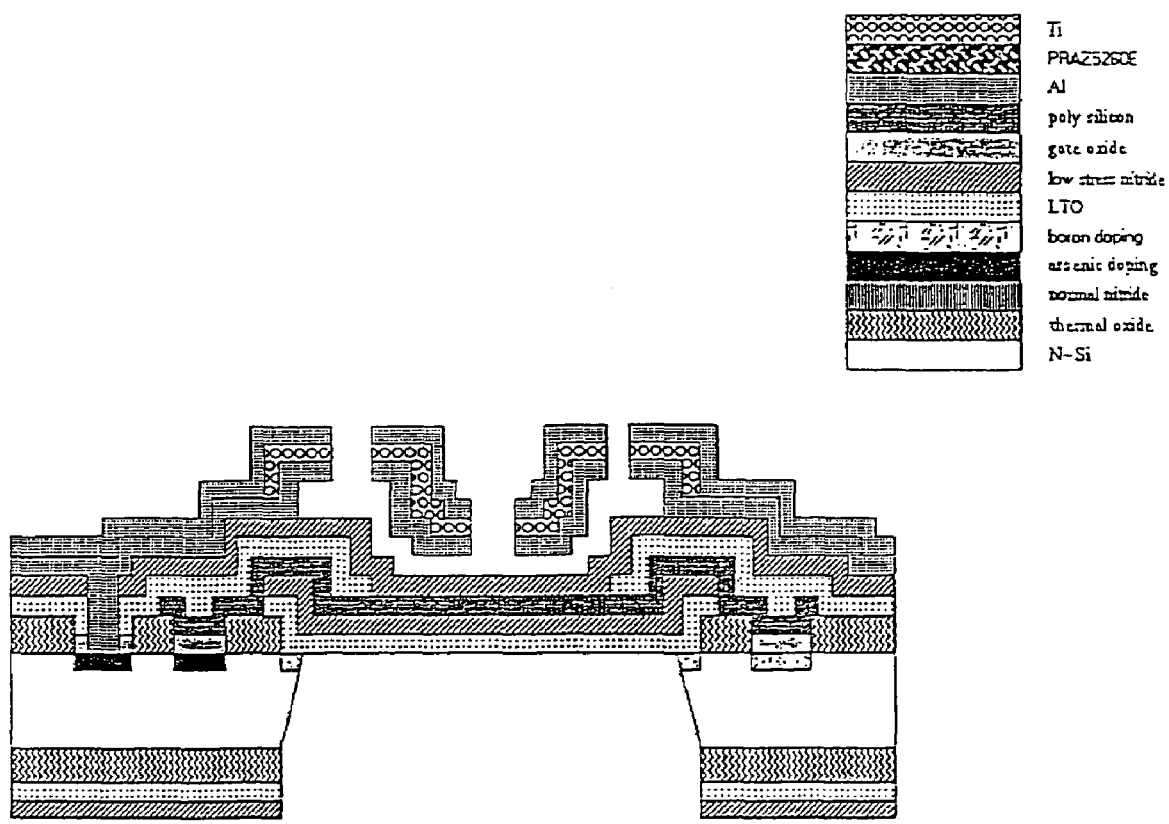

A gird of ventilation holes (FIG. 2(e)) together with interconnections is patterned. Access to the bottom of the membrane is achieved by etching through the silicon wafer from the underside. The top of the membrane is released by removing the poly-Si sacrificial layer through the ventilation holes.

Figure 3:
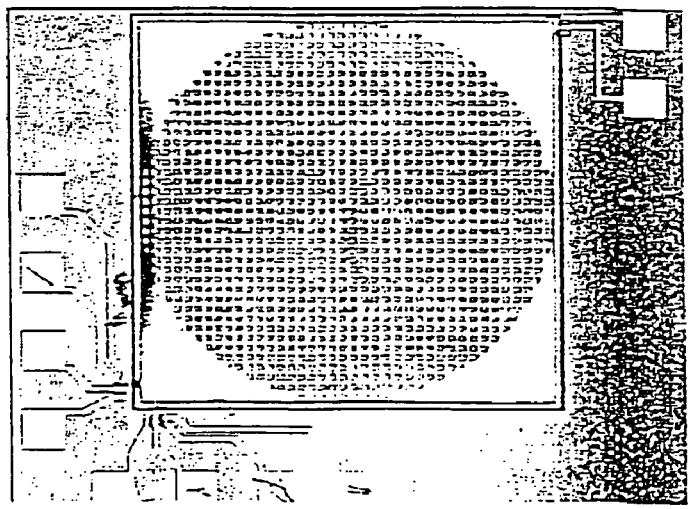
FIG. 3 is a photograph of a device manufactured in accordance with an embodiment of the invention,
FIG. 4 plots the simulated dependence of the frequency response on the membrane size,
FIG. 5 plots the simulated dependence of the frequency response on ventilation hole density.

FIG. 3 shows a plan-view photograph of a completed device. The square perforated top membrane occupies the center of the photograph. The tunneling window and the substrate contact are located at the top right-hand corner of the membrane. A set of sensing transistors is located at the lower left-hand corner of the membrane.

Figure 4:
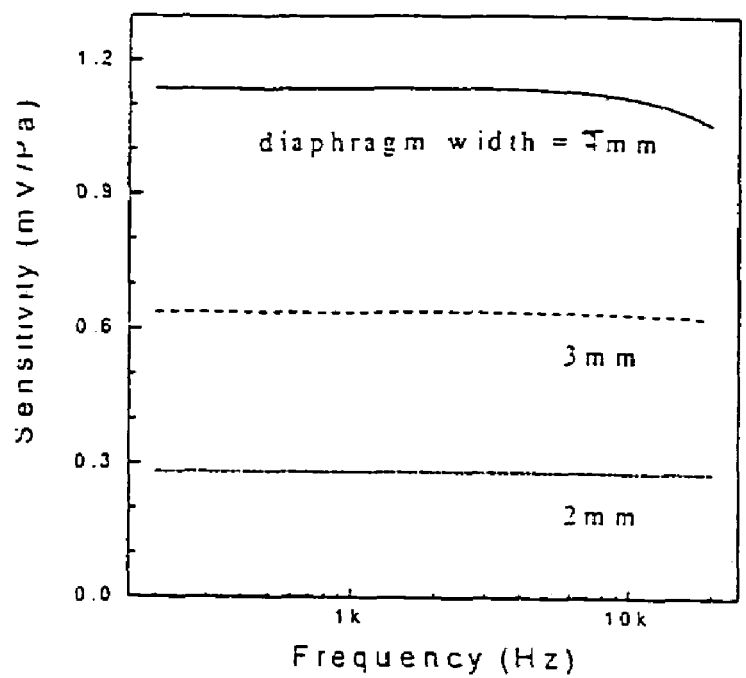
Figure 5:
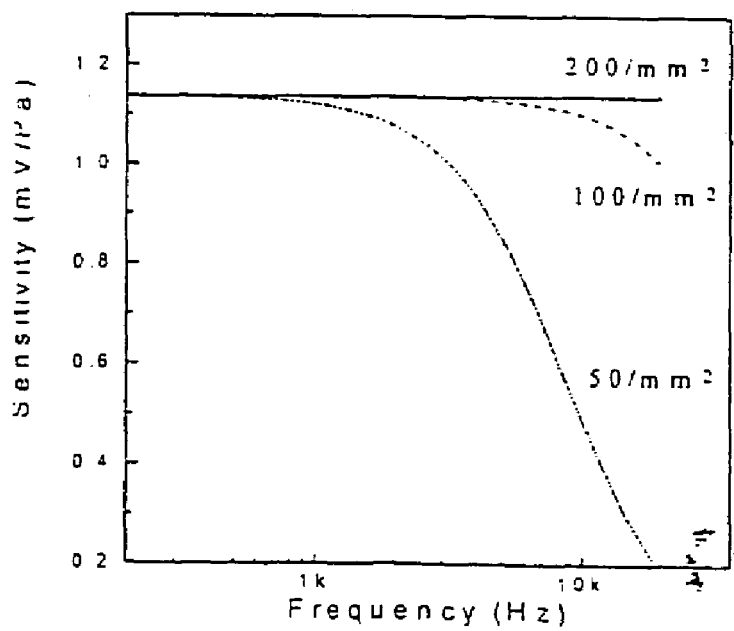

FIG. 4 is a plot showing the simulated dependence of the frequency response on the membrane size, while FIG. 5 is a plot showing the simulated dependence of the frequency response on the ventilation hole density. These plots show that the performance of a microphone in accordance with an embodiment of the invention improves with increasing membrane size and increasing ventilation hole density.

FIG. 6 shows the measured response of an integrated microphone in accordance with an embodiment of this invention when excited by acoustic signals. When the sensing membrane is excited by acoustic signals, the change in capacitance of the sensing capacitor is converted to a voltage signal, since the floating gate provides a relatively constant electric field due to the injected charge. The change in the voltage is converted by the current-buffer to a measurable output signal.

It will thus be seen that, at least in preferred embodiments, the present invention provides for the simultaneous realisation of both the mechanical and electrical components of an integrated microphone using microfabrication processes. Micro-fabrication, being fundamentally a batch-fabrication technique greatly reduces the unit production cost.

The invention claimed is:

1. An integrated semiconductor microphone, comprising:
   a sensing diaphragm having a polysilicon conductor layer and a pair of insulator layers, respectively, disposed on opposite sides of said conductor layer, wherein a portion of said conductor layer extends beyond an edge of at least one of said insulator layers; and
   at least one sensing transistor, wherein said extended portion of said conductor layer forms the gate conductor of said sensing transistor.

2. A microphone as claimed in claim 1, further comprising:
   a counter electrode in the form of a perforated rigid backplate membrane.

3. A microphone as claimed in claim 2, wherein the counter electrode is set to a bias voltage, and wherein the potential of the polysilicon layer, which also constitutes the gate potential of the sensing transistor, vary in accordance with the acoustic pressure, and wherein the gate potential is biased in the conducting regime in which variations in the gate voltage vary the output voltage of the sensing transistor.

4. A microphone as claimed in claim 2, wherein the potential of the polysilicon layer is fixed and an output current from the polysilicon layer or the counter electrode varies in response to acoustic pressure on the sensing diaphragm and is taken as the output signal.

5. A microphone as claimed in claim 2, wherein said microphone is operable in a constant charge mode by first charging the polysilicon layer followed by setting the potential of the counter electrode to ground and biasing the sensing transistor to a conducting state.

6. A microphone as claimed in claim 5, wherein the charging of the polysilicon layer is by injection from the sensing transistor.

7. A microphone as claimed in claim 2, wherein said counter electrode is formed of a layer of a first conducting material and a layer of a second conducting material.

8. A microphone as claimed in claim 7, wherein said first conducting material is aluminium and said second conducting material is titanium.

9. A microphone as claimed in claim 1, wherein said insulator layers are formed of low stress nitride.

10. An integrated semiconductor microphone, comprising:
    a sensing diaphragm having a conducting layer and a pair of insulating layers, respectively disposed on opposite sides of said conducting layer, wherein a portion of said conducting layer extends beyond an edge of at least one of said insulating layers; and
    at least one sensing transistor, wherein said extended portion of said conducting layer forms the gate conductor of said sensing transistor.

* * * * *